(12) United States Patent
Kiso

(10) Patent No.: US 11,538,750 B2
(45) Date of Patent: Dec. 27, 2022

(54) TERMINAL STRUCTURE AND WIRING SUBSTRATE

(71) Applicant: Shinko Electric Industries, Co., Ltd., Nagano (JP)

(72) Inventor: Takahiko Kiso, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 17/235,690

(22) Filed: Apr. 20, 2021

(65) Prior Publication Data

US 2021/0335705 A1 Oct. 28, 2021

(30) Foreign Application Priority Data

Apr. 24, 2020 (JP) .............................. JP2020-077477

(51) Int. Cl.
*H01L 23/522* (2006.01)
*H01L 23/498* (2006.01)
*H01L 23/00* (2006.01)

(52) U.S. Cl.
CPC .... *H01L 23/5226* (2013.01); *H01L 23/49816* (2013.01); *H01L 24/13* (2013.01); *H01L 24/14* (2013.01)

(58) Field of Classification Search
CPC ................ H01L 23/5226; H01L 24/14; H01L 23/49816; H01L 24/13; H01L 21/76805; H01L 21/76877
See application file for complete search history.

(56) References Cited

U.S. PATENT DOCUMENTS

| | | | | |
|---|---|---|---|---|
| 5,438,223 A | * | 8/1995 | Higashi | H05K 3/321 257/734 |
| 10,529,662 B2 | * | 1/2020 | Briggs | H01L 21/76847 |
| 2007/0123032 A1 | * | 5/2007 | Yamazaki | H01L 23/5226 257/E21.578 |
| 2017/0179012 A1 | * | 6/2017 | Shimodaira | H01L 23/3185 |

FOREIGN PATENT DOCUMENTS

JP 2012054519 A 3/2012

* cited by examiner

*Primary Examiner* — Phat X Cao
(74) *Attorney, Agent, or Firm* — Tarolli, Sundheim, Covell & Tummino LLP

(57) ABSTRACT

A terminal structure includes a wiring layer, a protective insulation layer, an open portion, and a connection terminal. The protective insulation layer covers the wiring layer. The open portion extends through the protective insulation layer in a thickness-wise direction to expose part of an upper surface of the wiring layer. The connection terminal is formed on the wiring layer exposed from the open portion. The open portion includes a wall surface, a depression, and a projection. The wall surface extends downward from an upper surface of the protective insulation layer. The depression is depressed into the protective insulation layer from the wall surface toward an outer side of the open portion. The projection is formed under the depression, continuously with the depression, and projected from the depression into the open portion further inward than the wall surface in a plan view. The depression is filled with the connection terminal.

9 Claims, 8 Drawing Sheets

TERMINAL STRUCTURE AND WIRING SUBSTRATE

CROSS-REFERENCE TO RELATED APPLICATION

This application is based upon and claims the benefit of priority from prior Japanese Patent Application No. 2020-077477, filed on Apr. 24, 2020, the entire contents of which are incorporated herein by reference.

FIELD

The present disclosure relates to a terminal structure, a wiring substrate, and a method for manufacturing and a terminal structure.

BACKGROUND

Various shapes and structures have been suggested for a wiring substrate on which electronic components such as a semiconductor element and the like are mounted. In recent years, an increase in integration and sophistication of semiconductor elements has resulted in a higher demand for finer wiring of the wiring substrate on which semiconductor elements are mounted. To meet such a demand, a wiring substrate includes an insulating layer applied to a base substrate on which a wiring pattern is formed. A via hole extends through the insulating layer in a thickness-wise direction, and a rod-shaped connection terminal is formed on the wiring pattern exposed through the via hole (refer to Japanese Laid-Open Patent Publication No. 2012-54519).

SUMMARY

The thermal expansion coefficient differs between the connection terminal (e.g. copper layer) and the insulating layer (e.g. resin). Thus, when the insulating layer undergoes heat treatment, the insulating layer will be deformed due to thermal contraction. This may form a gap between the side surface of the connection terminal and the insulating layer. When a gap is formed between the side surface of the connection terminal and the insulating layer, the connection terminal may easily be separated from the insulating layer.

An embodiment of a terminal structure includes a wiring layer, a protective insulation layer, an open portion, and a connection terminal. The protective insulation layer covers the wiring layer. The open portion extends through the protective insulation layer in a thickness-wise direction to expose part of an upper surface of the wiring layer. The connection terminal is formed on the wiring layer exposed from the open portion. The open portion includes a wall surface, a depression, and a projection. The wall surface extends downward from an upper surface of the protective insulation layer. The depression is depressed into the protective insulation layer from the wall surface toward an outer side of the open portion. The projection is formed under the depression, continuously with the depression, and projected from the depression into the open portion further inward than the wall surface in a plan view. The depression is filled with the connection terminal.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
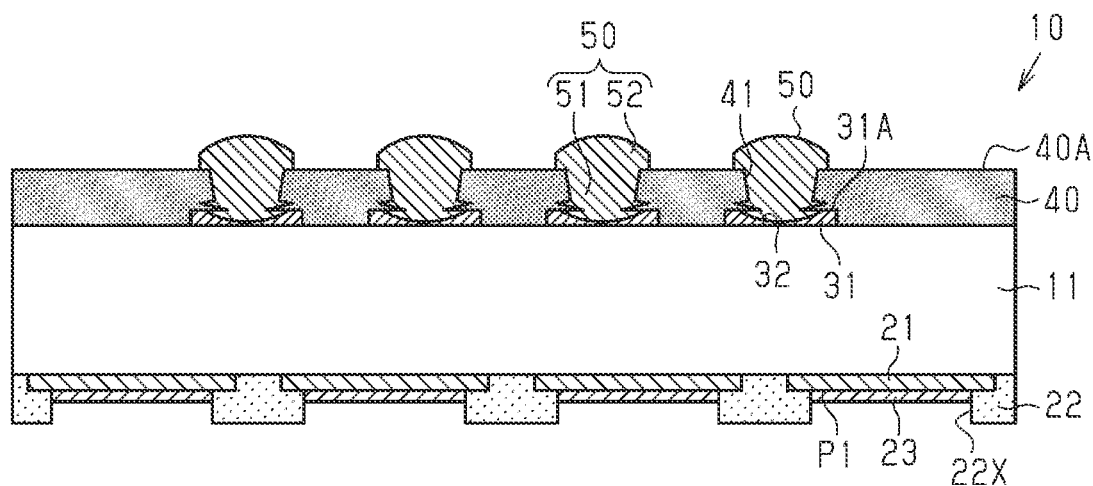
FIG. 1A is a schematic cross-sectional view illustrating a wiring substrate of an embodiment.

Embodiments will be described below with reference to the accompanying drawings.

The drawings may not be to scale, and the relative size, proportions, and depiction of elements in the drawings may be exaggerated for clarity, illustration, and convenience. Moreover, to facilitate understanding, hatching lines may not be illustrated or be replaced by shadings in the cross-sectional drawings. In the specification, "plan view" refers to a view of a subject taken in a vertical direction (for example, up-down direction in FIG. 1A). Further, "planar shape" refers to a shape of a subject viewed in the vertical direction. Moreover, in the specification, "parallel", "orthogonal", and "horizontal" include not only strictly parallel, strictly orthogonal, and strictly horizontally states but also include generally parallel, generally orthogonal, and generally horizontal states within a range allowing advantages of the embodiment of the specification to be obtained.

As illustrated in FIG. 1A, a wiring substrate 10 includes a substrate body 11. A wiring layer 21 and a solder resist layer 22 are sequentially laminated on a lower surface of the substrate body 11. Further, a wiring layer 31, a solder resist layer 40, and connection terminals 50 are sequentially laminated on an upper surface of the substrate body 11. The solder resist layer 40 is an example of a protective insulation layer.

The substrate body 11 may be, for example, a core substrate. Alternatively, a build-up substrate, which includes a core substrate, or a coreless substrate, which does not include a core substrate, may be used as the substrate body 11. When a coreless substrate is used as the substrate body 11, for example, a side surface and an upper surface of the lowermost wiring layer 21 may be embedded in the lowermost insulating layer of the substrate body 11, and a lower surface of the lowermost wiring layer 21 may be exposed from the lowermost insulating layer.

The material of the wiring layers 21 and 31 and the connection terminals 50 may be, for example, copper (Cu) or a copper alloy. The material of the solder resist layers 22 and 40 may be, for example, a photosensitive insulating resin that has a phenol resin, a polyimide resin, or the like as a main component. The solder resist layers 22 and 40 may include, for example, a filler such as silica or alumina. The material of the solder resist layer 40 may be a resin material that has a higher elasticity than the metal material of the connection terminal 50.

The wiring layer 21 is formed on the lower surface of the substrate body 11. The wiring layer 21 is the lowermost wiring layer of the wiring substrate 10.

The solder resist layer 22 is laminated on the lower surface of the substrate body 11 partially covering the wiring layer 21. The solder resist layer 22 includes openings 22X to expose parts of a lower surface of the wiring layer 21 as external connection pads P1. An external connection terminal 62 (refer to FIG. 2A) is connected to each external connection pad P1 and used to mount the wiring substrate 10 on a mounting board such as a motherboard or the like.

In the present example, in a cross-sectional view, a wall surface of each opening 22X extends substantially orthogonal to the lower surface of the wiring layer 21. However, the opening 22X is not limited to the shape illustrated in FIG. 1A. For example, the wall surface of the opening 22X may be curved. Alternatively, the opening 22X may be tapered.

When necessary, a surface-processed layer 23 is formed on the lower surface of the wiring layer 21, which is exposed from the bottom of each opening 22X. Examples of the surface-processed layer 23 include a gold (Au) layer, a nickel (Ni) layer/Au layer (metal layer in which Ni layer and Au layer are sequentially laminated with Ni layer being bottom layer), a Ni layer/palladium (Pd) layer/Au layer (metal layer in which Ni layer, Pd layer, and Au layer are sequentially laminated with Ni layer being bottom layer), and the like. Examples of the surface-processed layer 23 further include a Ni layer/Pd layer (metal layer in which Pd layer is laminated on Ni layer with Ni layer being bottom layer), a Pd layer/Au layer (metal layer in which Au layer is laminated on Pd layer with Pd layer being bottom layer), and the like. The Au layer is a metal layer of Au or an Au alloy. The Ni layer is a metal layer of Ni or a Ni alloy. The Pd layer is a metal layer of Pd or a Pd alloy. The Au layer, Ni layer, and Pd layer may each be, for example, a metal layer formed in an electroless plating process (electroless plating layer) or a metal layer formed in an electrolytic plating process (electrolytic plating layer). Further, the surface-processed layer 23 may use an organic solderability preservative (OPS) film formed by performing an antioxidation process, such as an organic solderability preservative (OPS), on the lower surface of the wiring layer 21, which is exposed from the openings 22X. The OSP film may be, for example, an organic coating of an azole compound, an imidazole compound, or the like. When the surface-processed layer 23 is formed on the lower surface of the wiring layer 21, the surface-processed layer 23 functions as the external connection pads P1.

In the present example, the external connection terminals 62 (refer to FIG. 2A) are arranged on the surface-processed layer 23. Alternatively, the wiring layer 21 exposed from the openings 22X (or surface-processed layer 23 when surface-processed layer 23 is formed on wiring layer 21) may be used as the external connection terminals.

The wiring layer 31 is formed on the upper surface of the substrate body 11. The wiring layer 31 is electrically connected to the wiring layer 21 via wiring layers and through-electrodes in the substrate body 11. An upper surface 31A of the wiring layer 31 includes recesses 32 that are recessed toward the substrate body 11. The recesses 32 may have any planar shape and size. In the present example, each recess 32 has a circular planar shape.

The solder resist layer 40 is laminated on the upper surface of the substrate body 11 partially covering the wiring layer 31. The solder resist layer 40 is the outermost (here, uppermost) insulating layer of the wiring substrate 10. The solder resist layer 40 may have a thickness from the upper surface 31A of the wiring layer 31 to an upper surface 40A of the solder resist layer 40 that is, for example, approximately 10 to 30 μm.

The solder resist layer 40 includes open portions 41 extending through the solder resist layer 40 in a thickness-wise direction to expose parts of the upper surface 31A of the wiring layer 31. Each open portion 41 exposes, for example, the surface of one of the recesses 32 in the wiring layer 31. In an example illustrated in FIG. 1B, part of the surface of the recess 32 is exposed from the bottom of the open portion 41. The open portion 41 may have any planar shape and size. The planar shape of the open portion 41 may, for example, correspond to that of the recess 32. In the present example, the open portion 41 has a circular planar shape. The depth of the open portion 41 may be, for example, approximately 10 to 30 μm. In the present example, the open portion 41 is tapered as a whole to have an opening width (opening diameter) that decreases from the upper side in FIG. 1A (upper surface 40A of solder resist layer 40) toward the lower side (side closer to substrate body 11).

Figure 1B:
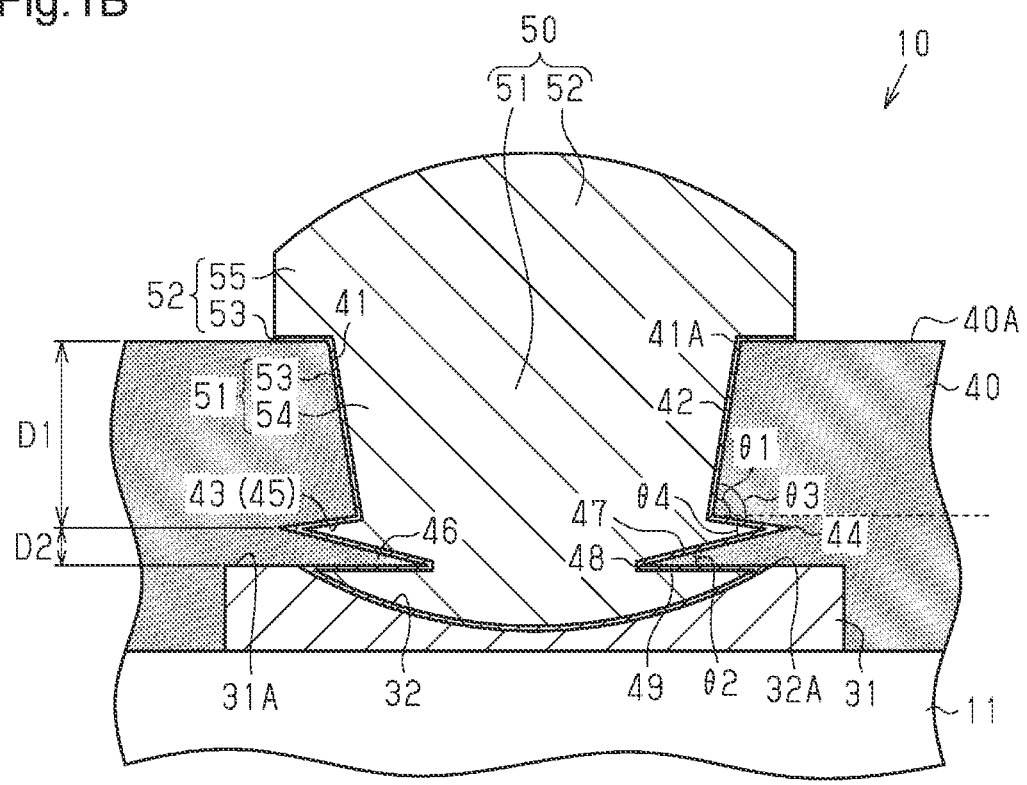
FIG. 1B is an enlarged partial cross-sectional view of the wiring substrate illustrated in FIG. 1A.

As illustrated in FIG. 1B, a step is formed in an intermediate part of the open portion 41 in a depth-wise direction of the open portion 41. For example, the open portion 41 includes a step at the bottom of the open portion 41. The open portion 41 includes a wall surface 42, a depression 43, and a projection 46. The wall surface 42 extends downward from the upper surface 40A of the solder resist layer 40. The depression 43 is depressed into the solder resist layer 40 from the wall surface 42 toward an outer side of the open portion 41. In other words, the depression 43 is formed in the wall surface 42 and extends into the solder resist layer 40. The projection 46 is formed under the depression 43 and continuous with the depression 43. Further, the projection 46 projects from the depression 43 into the open portion 41 further inward than the wall surface 42 in a plan view. The depression 43 and the projection 46 are continuous and formed at the bottom of the open portion 41. Further, the depression 43 is continuous with the projection 46 over the entire circumference of the open portion 41. The depression 43 and the projection 46 form the step at the bottom of the open portion 41. The projection 46 forms a bottom surface of the open portion 41.

The open portion 41 includes an open end 41A at an upper end of the wall surface 42. The open end 41A is the upper end of the open portion 41. The open portion 41 has a first opening width at the open end 41A. The wall surface 42 of the open portion 41 extends, for example, downward from the open end 41A to the depression 43. The wall surface 42 is, for example, inclined to extend downward from the open end 41A toward the inner side of the open portion 41 (that is, center of open portion 41 in a plan view). For example, the wall surface 42 is inclined from the upper surface 40A of the solder resist layer 40 toward the depression 43 so as to approach a planar center of the open portion 41. The planar center of the open portion 41 is defined as the center of the open portion 41 in a plan view. The wall surface 42 does not have to be flat in a cross-sectional view and may be a partially or entirely convex or concave surface. In the present example, in a cross-sectional view, the wall surface 42 is an inclined flat surface that is straight and free from steps. In other words, the wall surface 42 is inclined at a constant inclination angle θ1. In the specification, the inclination angle θ1 is an acute angle that is defined between a line segment extending along the wall surface 42 and the upper surface 31A of the wiring layer 31.

The depression 43 is continuous with a lower end of the wall surface 42. The depression 43 increases the opening width of the open portion 41 (opening diameter in the present example). Thus, the depression 43 results in the opening width of the open portion 41 under the lower end of the wall surface 42 being larger than the opening width at the lower end of the wall surface 42.

The depression 43 includes an innermost end 44 and an inner surface 45. The innermost end 44 is in a deepest part of the depression 43 (sideward end of depression 43 in FIG. 1B). The inner surface 45 extends from the lower end of the wall surface 42 toward the outer side of the open portion 41, that is, to the innermost end 44. In a plan view, the innermost end 44 is the part of the depression 43 that is located farthest from the lower end of the wall surface 42. For example, the inner surface 45 is inclined to extend downward from the lower end of the wall surface 42 toward the outer side of the open portion 41 (that is, away from planar center of open portion 41). The inner surface 45 does not have to be flat in a cross-sectional view and may be a partially or entirely convex or concave surface. In the present example, in a cross-sectional view, the inner surface 45 is an inclined flat surface that is straight and free from steps.

The open portion 41 has a second opening width at the depression 43. The second opening width of the open portion 41 (that is, opening width at depression 43) is larger than the opening width at the lower end of the wall surface 42 of the open portion 41. The second opening width is set to be, for example, larger than or equal to the first opening width of the open portion 41 (that is, opening width at open end 41A). The second opening width may be defined as, for example, the opening width of the open portion 41 at the innermost end 44 of the depression 43. In this case, the opening width at the innermost end 44 may be set to be larger than or equal to the opening width at the open end 41A. In the present example, the opening width at the innermost end 44 is set to be larger than the opening width at the open end 41A. Therefore, in a plan view, the innermost end 44 is located further into the solder resist layer 40 from the open end 41A. In other words, in a plan view, the innermost end 44 is located farther from the planar center of the open portion 41 than the open end 41A.

The projection 46 includes a projection end 48 and an inclined surface 47. In a plan view, the projection end 48 is arranged in the open portion 41 at a position located inward from the lower end of the wall surface 42 (that is, relatively close to planar center of open portion 41). The inclined surface 47 extends from the innermost end 44 of the depression 43 to the projection end 48. The inclined surface 47 is continuous with the innermost end 44. The inclined surface 47 is, for example, inclined to extend downward from the innermost end 44 toward the planar center of the open portion 41. Therefore, the inclined surface 47 is inclined from the innermost end 44 to the projection end 48 so as to approach the planar center of the open portion 41. The projection end 48 is the lower end of the projection 46 and the part of the projection 46 that is the closest to the planar center of the open portion 41. The inclined surface 47 does not have to be flat in a cross-sectional view and may be partially or entirely convex or concave surface. In the present example, in a cross-sectional view, the inclined surface 47 is an inclined flat surface that is straight and free from steps. In the present example, the inclined surface 47 is inclined at a constant inclination angle θ2. The inclination angle θ2 of the inclined surface 47 is, for example, smaller than the inclination angle θ1 of the wall surface 42. In the specification, the inclination angle θ2 refers to the angle between the upper surface 31A of the wiring layer 31 and the inclined surface 47. The inclination angle θ2 is an acute angle.

In a plan view, the projection end 48 is closer to the planar center of the open portion 41 than the lower end of the wall surface 42. That is, the projection end 48 is closer to the planar center of the open portion 41 than the wall surface 42. For example, in a plan view, the projection end 48 would be closer to the planar center of the open portion 41 than the inner surface 42 even if the wall surface 42 were to be extended to the upper surface 31A of the wiring layer 31 at the inclination angle θ1. The open portion 41 has a third opening width at the projection 46. The third opening width of the open portion 41 (that is, opening width at projection 46) is set to be the smallest opening width of the open portion 41. The third opening width may be defined as, for example, the opening width of the open portion 41 at the projection end 48 of the projection 46. In this manner, as compared with when the opening width is determined by only the wall surface 42, the projection 46 decreases the opening width of the open portion 41.

The projection 46 includes, for example, a lower surface 49 continuous with the projection end 48. The lower surface 49 extends toward the outer side of the open portion 41 from the projection end 48. The lower surface 49 extends, for example, in parallel to the upper surface 31A of the wiring layer 31. The inclination angle θ2 may be referred to as the interior angle between the lower surface 49 and the inclined surface 47.

An interior angle θ3 between the wall surface 42 and the inner surface 45 is smaller than 180 degrees. The angle θ3 is, for example, an obtuse angle. The angle θ3 is the angle between the wall surface 42 and the inner surface 45. An interior angle θ4 between the inner surface 45 and the inclined surface 47 is, for example, set to be smaller than the angle θ3. The angle θ4 is the angle between the inner surface 45 and the inclined surface 47. The angle θ4 is set to be larger than the angle between the inclined surface 47 and the lower surface 49, that is, the inclination angle θ2.

Further, a depth D1 of the open portion 41 from the upper surface 40A of the solder resist layer 40 to the innermost end 44 of the depression 43 is greater than a depth D2 of the open portion 41 from the innermost end 44 to the lower surface 49 of the projection 46. The depth D1 may be set to, for example, seven to ten times greater than the depth D2. The ratio of the depth D1 and the depth D2 may be, for example, approximately D1:D2=10:1.3.

In the specification, the projection 46 refers to the part of the open portion 41 extending from the innermost end 44 of the depression 43 to the projection end 48. In the present example, when in a cross-sectional view, the projection 46 is substantially triangular and has a thickness that decreases from the innermost end 44 toward the inner side of the open portion 41. Part of the inclined surface 47 in the vicinity of the innermost end 44 also forms, for example, the depression 43. For example, the part of the inclined surface 47 overlapped with the inner surface 45 in a plan view forms the depression 43. That is, part of the inclined surface 47 forms both the projection 46 and the depression 43. In this case, the depression 43 is formed by the inner surface 45 and part of the inclined surface 47.

In the present example, in a plan view, the projection 46 projects toward an inner side of the recess 32 in the wiring layer 31. The projection 46 is located upward from the recess 32. In a plan view, the projection 46 is overlapped with a circumferential portion of the recess 32. In a plan view, the projection 46 is ring-shaped and projects toward the inner side of the recess 32 (that is, above recess 32).

The recess 32 is connected with the open portion 41. The recess 32 extends, for example, from the upper surface 31A of the wiring layer 31 to an intermediate part of the wiring layer 31 in the thickness-wise direction. That is, the bottom surface of the recess 32 is located at an intermediate part of the wiring layer 31 in the thickness-wise direction. Therefore, the recess 32 does not extend through the wiring layer 31 in the thickness-wise direction.

The recess 32 includes an open end 32A at the upper surface 31A of the wiring layer 31. The open end 32A is the upper end of the recess 32. An opening width of the recess 32 at the open end 32A is set to be larger than the opening width of the open portion 41 at the projection end 48. The recess 32 exposes, for example, part of the lower surface 49 of the projection 46. The projection 46 projects from the open end 32A of the recess 32 and overhangs the recess 32. In a plan view, the open end 32A of the recess 32 is farther from the planar center of the open portion 41 than the projection end 48. In a plan view, the open end 32A is, for example, overlapped with the open end 41A of the open portion 41 or farther from the planar center of the open portion 41 than the open end 41A of the open portion 41. In a plan view, the open end 32A is, for example, overlapped with the innermost end 44 of the depression 43 or closer to the planar center of the open portion 41 than the innermost end 44 of the depression 43. In the present example, in a plan view, the open end 32A is located between the open end 41A of the open portion 41 and the innermost end 44 of the depression 43.

The recess 32 has, for example, a semicircular or semi-elliptic cross-sectional shape. The surface of the recess 32 is, for example, curved to have an arced cross section. The surface of the recess 32 is curved and extends downward from the open end 32A of the recess 32 toward the planar center of the open portion 41. The depth of the recess 32 may be, for example, approximately 2 to 7 μm.

The connection terminal 50 is formed on the wiring layer 31, which is exposed from the open portion 41. The connection terminal 50 includes, for example, via wiring 51 and a rod-shaped terminal 52. The open portion 41 is filled with the via wiring 51. The terminal 52 is formed on the upper surface of the solder resist layer 40 and is electrically connected to the wiring layer 31 by the via wiring 51.

In the example of FIG. 1B, the open portion 41 and the recess 32 of the wiring layer 31 are filled with the via wiring 51. The via wiring 51 is shaped in correspondence with the open portion 41 and the recess 32. Thus, the via wiring 51 fills the depression 43 and covers the upper and lower surfaces of the projection 46, that is, the inclined surface 47 and the lower surface 49. Therefore, the via wiring 51 extends into the solder resist layer 40 at the depression 43. Further, the projection 46, which is the solder resist layer 40, extends into the via wiring 51.

The connection terminal 50 includes a seed layer 53 that covers the surface of the recess 32, the surface of the open portion 41, and the upper surface 40A of the solder resist layer 40. In the present example, the seed layer 53 continuously coats the upper surface 40A of the solder resist layer 40, the entire wall surface 42 of the open portion 41, the entire inner surface 45 of the depression 43, the entire inclined surface 47 of the projection 46, the entire lower surface 49 exposed from the recess 32, and the entire surface of the recess 32. The material of the seed layer 53 may be, for example, copper or a copper alloy. The seed layer 53 may be, for example, an electroless plating layer formed in an electroless plating process.

The connection terminal 50 includes a metal layer 54 that fills the open portion 41 and the recess 32 at the inner side of the seed layer 53. In the present example, the metal layer 54 fills the depression 43 and covers the inclined surface 47 and the lower surface 49 of the projection 46. The material of the metal layer 54 may be, for example, copper or a copper alloy. The metal layer 54 may be, for example, an electrolytic plating layer formed in an electrolytic plating process.

The seed layer 53 and the metal layer 54 are formed in the open portion 41 and the recess 32 to form the via wiring 51 of the connection terminal 50.

The connection terminal 50 includes a metal post 55 formed on the via wiring 51 (metal layer 54) and the seed layer 53 formed on the upper surface 40A of the solder resist layer 40. The metal post 55 is rod-shaped and projects upward from the upper surface 40A of the solder resist layer 40. The metal post 55 includes an upper surface that is, for example, curved like an arc. The upper surface of the metal post 55 is, for example, a convex surface. For example, the upper surface of the metal post 55 is bulged to project further upward from a side surface of the metal post 55 as the planar center of the metal post 55 becomes closer. The metal post 55 is, for example, formed integrally with the metal layer 54. The material of the metal post 55 may be, for example, copper or a copper alloy. The metal post 55 may be, for example, an electrolytic plating layer formed in an electrolytic plating process.

The metal post 55 and the seed layer 53, which are formed on the upper surface 40A of the solder resist layer 40, form the rod-shaped terminal 52 of the connection terminal 50.

The connection terminal 50 functions as, for example, an electronic component mounting pad that is electrically connected to an electronic component. A surface-processed layer may be formed on the surface (upper and side surfaces or only upper surface) of the rod-shaped terminal 52. Examples of the surface-processed layer include an Au layer, a Ni layer/Au layer, a Ni layer/Pd layer/Au layer, or an OSP film.

The terminal structure of the wiring substrate 10 includes the wiring layer 31, the solder resist layer 40, the open portion 41 formed in the solder resist layer 40, and the connection terminal 50.

In FIGS. 1A and 1B, the innermost end 44 of the depression 43 and the projection end 48 of the projection 46 are illustrated as sharp ends. However, the innermost end 44 and the projection end 48 are actually curved. In the other drawings, the innermost end 44 and the projection end 48 are also illustrated as sharp ends.

The structure of a semiconductor device 60 will now be described with reference to FIGS. 2A and 2B.

Figure 2A:
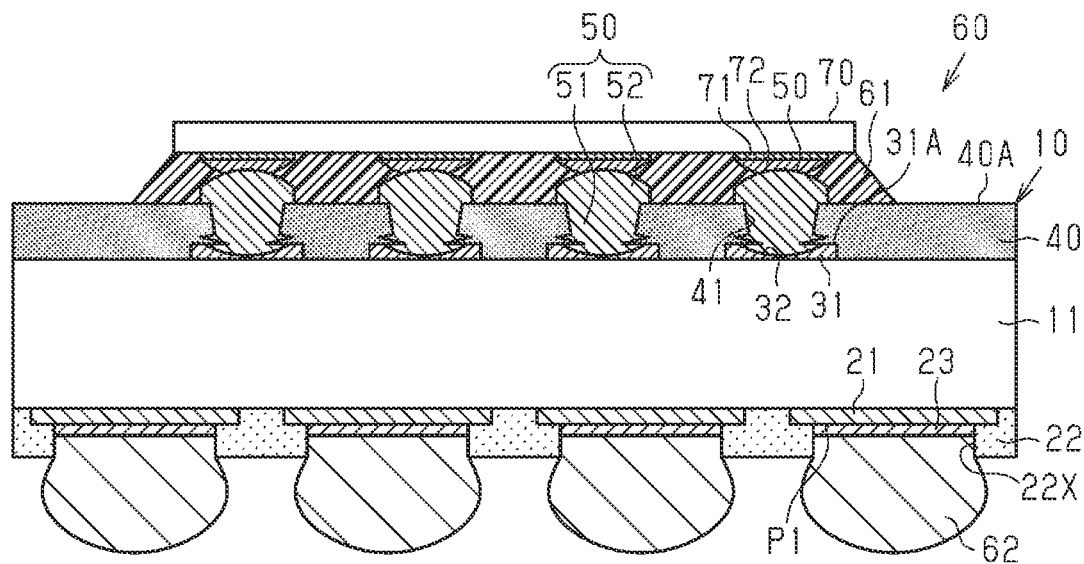
FIG. 2A is a schematic cross-sectional view of a semiconductor device including the wiring substrate illustrated in FIG. 1A.

As illustrated in FIG. 2A, the semiconductor device 60 includes the wiring substrate 10, one or more (one in the present example) semiconductor elements 70, an underfill resin 61, and the external connection terminals 62.

Figure 2B:
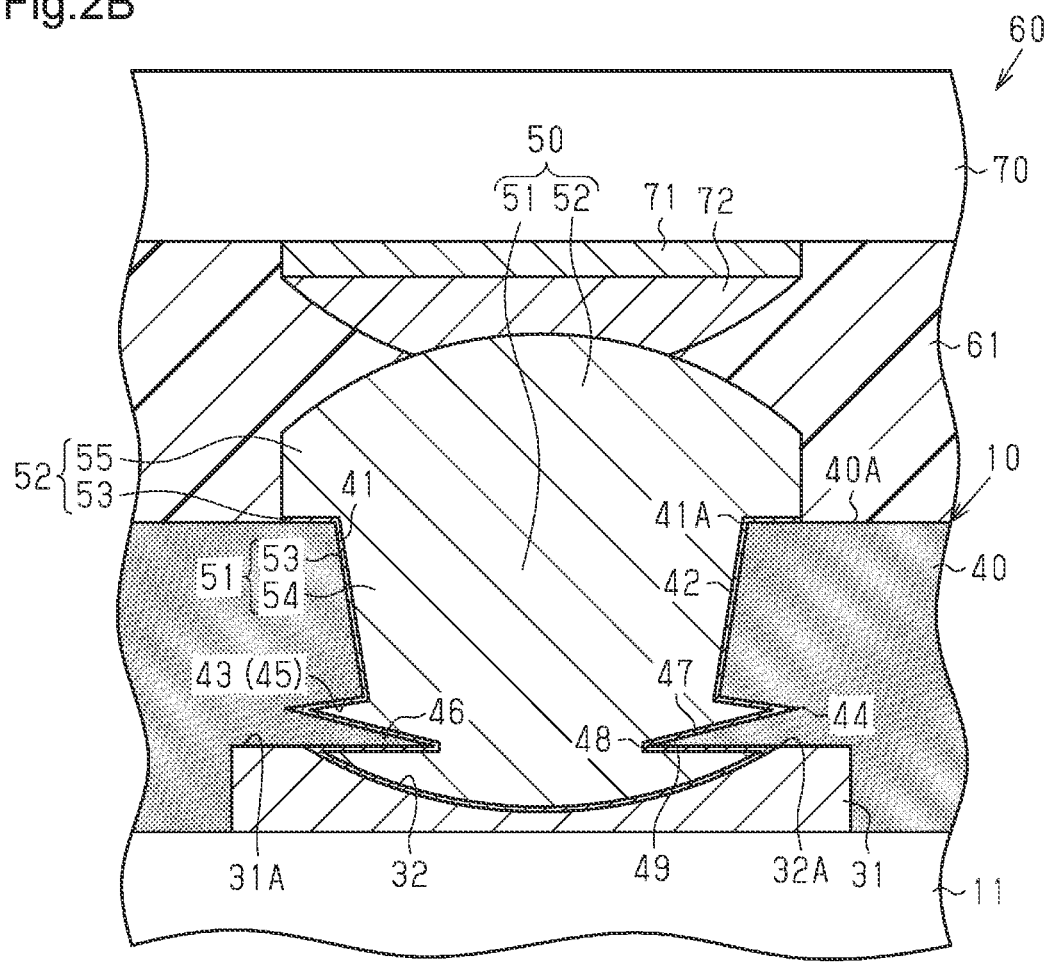
FIG. 2B is an enlarged partial cross-sectional view of the semiconductor device illustrated in FIG. 2A.

As illustrated in FIGS. 2A and 2B, the semiconductor element 70 is flip-chip mounted on the wiring substrate 10. For example, connection terminals 71 are arranged on a circuit formation surface (lower surface) of the semiconductor element 70 and joined with the connection terminals 50 of the wiring substrate 10 by a solder layer 72. This electrically connects the semiconductor element 70 to the connection terminals 50 via the connection terminals 71 and the solder layer 72. In this case, the solder layer 72 is joined with the upper surfaces of the connection terminals 50 and the lower surfaces of the connection terminals 71.

The semiconductor element 70 may be, for example, a logic chip such as a central processing unit (CPU) chip or a graphics processing unit (GPU) chip. Further, the semiconductor element 70 may be, for example, a memory chip such as a dynamic random access memory (DRAM) chip, a static random access memory (SRAM) chip, or a flash memory chip. When multiple semiconductor elements 70 are mounted on the wiring substrate 10, the logic chips and the memory chips may be combined and mounted on the wiring substrate 10.

The connection terminal 71 may be, for example, a metal post. The connection terminal 71 is, for example, a rod-shaped connection terminal extending downward from the circuit formation surface of the semiconductor element 70. The connection terminal 71 has, for example, the shape of a cylindrical post. The material of the connection terminal 71 may be, for example, copper or a copper alloy. In addition to a metal post, for example, a metal bump may also be used as the connection terminal 71.

The solder layer 72 may be, for example, solder plating of a lead-free solder. The material of the solder plating may be, for example, a lead-free solder of Sn—Ag, Sn—Cu, Sn—Ag—Cu, or Sn—Bi.

The space between the wiring substrate 10 and the semiconductor element 70 is filled with the underfill resin 61. The material of the underfill resin 61 may be, for example, an insulative resin such as epoxy resin.

As illustrated in FIG. 2A, the external connection terminals 62 are formed on the external connection pads P1 of the wiring substrate 10. Each external connection terminal 62 is, for example, a connection terminal that is electrically connected to a pad arranged on a mounting board such as a motherboard (not illustrated) or the like. For example, a solder ball or a lead pin may be used as the external connection terminal 62. In the present embodiment, a solder ball is used as the external connection terminal 62.

A method for manufacturing the wiring substrate 10 will now be described with reference to FIGS. 3A to 6B. The method for manufacturing the terminal structure of the wiring substrate 10 will be described in detail. To facilitate understanding, elements of the wiring substrate 10 are denoted by the same reference characters throughout the different stages of manufacturing in the drawings.

Figure 3A:
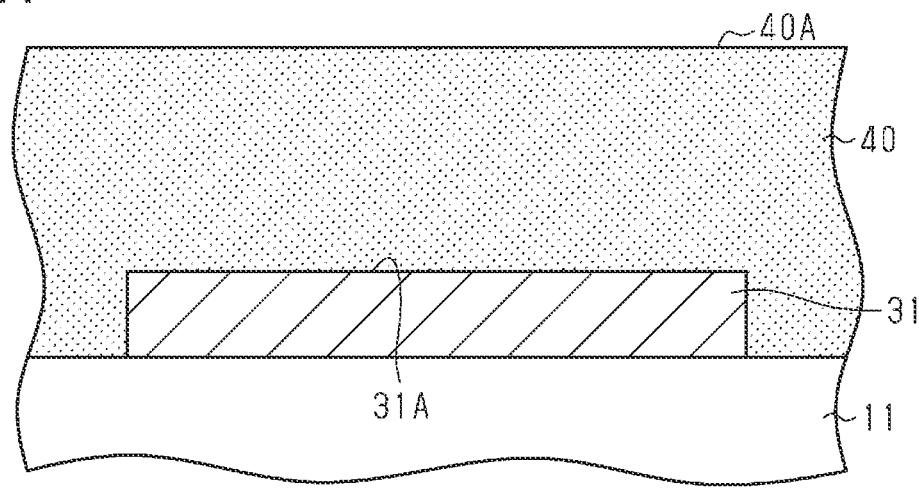
FIGS. 3A, 3B, 3C, 4A, 4B, 5A, 5B, 6A, and 6B are schematic cross-sectional views illustrating a manufacturing method of the wiring substrate illustrated in FIG. 1A.

First, as illustrated in FIG. 3A, a structural body is prepared by forming the wiring layer 31 and the solder resist layer 40 on the upper surface of the substrate body 11. The solder resist layer entirely covers the surfaces (upper and side surfaces) of the wiring layer 31. The structural body may be manufactured by a known manufacturing process, which will not be described in detail. The solder resist layer 40 may be formed on the substrate body 11, for example, by laminating a photosensitive solder resist or by applying a liquid solder resist. A negative-type photosensitive resin is used as the material of the solder resist layer 40. In a subsequent exposure and development step, a portion of the negative-type photosensitive resin is irradiated with light and hardened. The non-exposed portion is removed by a developing solution, and the exposed portion is left on the substrate body 11.

Figure 3B:
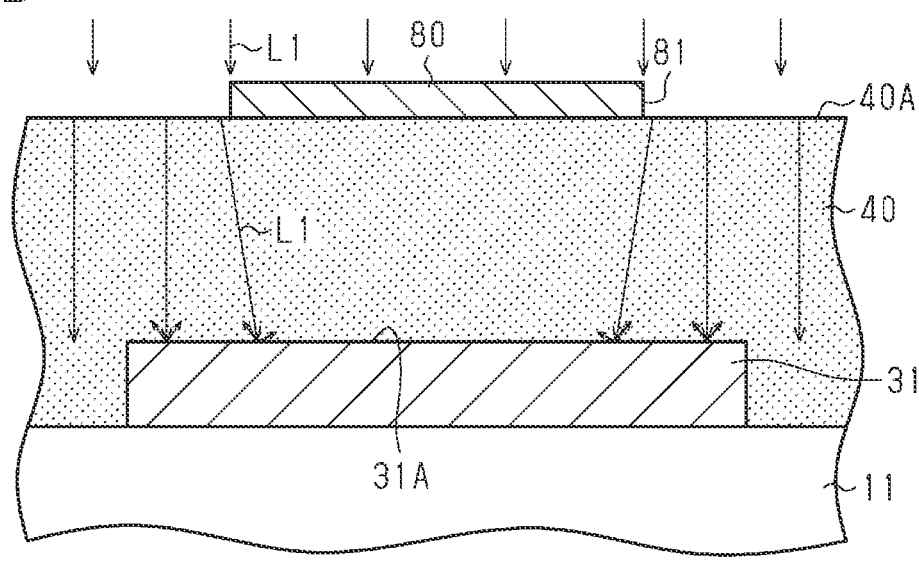
Figure 3C:
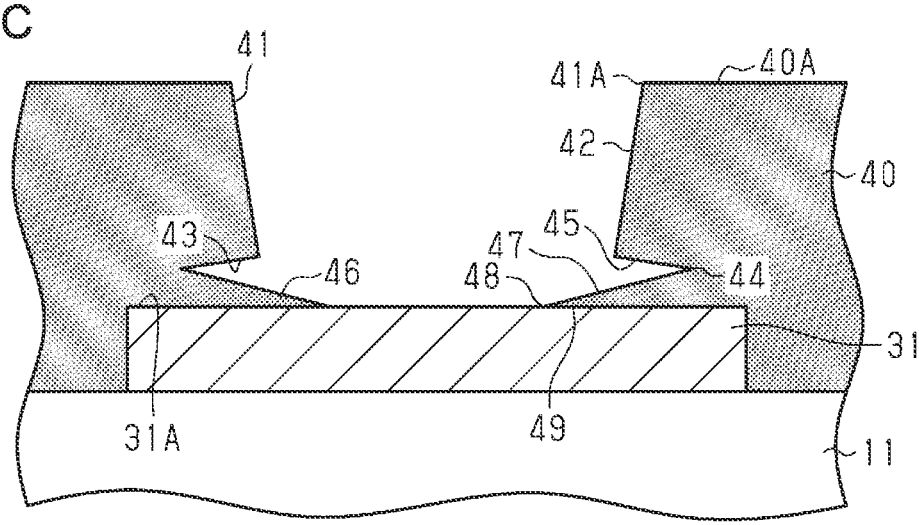

In the step illustrated in FIG. 3B, a photomask 80 is prepared to obtain the form of the open portion 41 illustrated in FIG. 1B. The photomask 80 is arranged upward from the solder resist layer 40. The photomask 80 shields portions corresponding to the open portions 41 from light and includes an opening pattern 81 that exposes portions that do not correspond to the open portions 41. Then, the solder resist layer 40 exposed from the opening pattern 81 of the photomask 80 is irradiated with light L1 so that the solder resist layer 40 undergoes exposure (exposure step). Then, as illustrated in FIG. 3C, the solder resist layer 40 undergoes development to remove the non-exposed portions with a developing solution (development step). This forms the open portions 41 in the solder resist layer 40. In this manner, photolithography is performed to form the open portions 41 in the solder resist layer 40. In the exposure step, for example, the amount of the light L1 reflected by the upper surface 31A of the wiring layer 31 is adjusted to 10% to 20% of the exposure light energy (exposure light amount) so that the projection 46 and the depression 43 are continuous and formed at the bottom of the open portion 41. In the exposure step illustrated in FIG. 3B, the pigment included in the solder resist layer 40 lowers the transmissivity of the light L1, and the filler in the photosensitive resin scatters the light L1. Thus, the lower part of the solder resist layer 40 is less exposed to light than the upper surface 40A, which is a resin surface, of the solder resist layer 40. That is, the hardening reaction occurs slowly at the lower part of the solder resist layer 40. Further, the reflection of the light L1 from the upper surface 31A of the wiring layer 31 in the solder resist layer 40 advances the hardening reaction in the vicinity of the upper surface 31A, which is a metal surface, of the wiring layer 31. Thus, the hardening reaction occurs more quickly at the part corresponding to the projection 46 illustrated in FIG. 3C. Since the lower part of the solder resist layer 40 resists exposure and hardening, the depression 43 is formed in the development step illustrated in FIG. 3C. Further, the projection 46 is formed as a result of the reflection of the light L1 from the upper surface 31A of the wiring layer 31. Consequently, the projection 46 and the depression 43 are continuous and formed at the bottom of the open portion 41. For example, the wavelength of the light L1 used in the exposure step and the composition of the solder resist layer 40 may be changed to adjust the ratio of the light L1 reflected by the upper surface 31A of the wiring layer 31 to the exposure light energy.

Figure 4A:
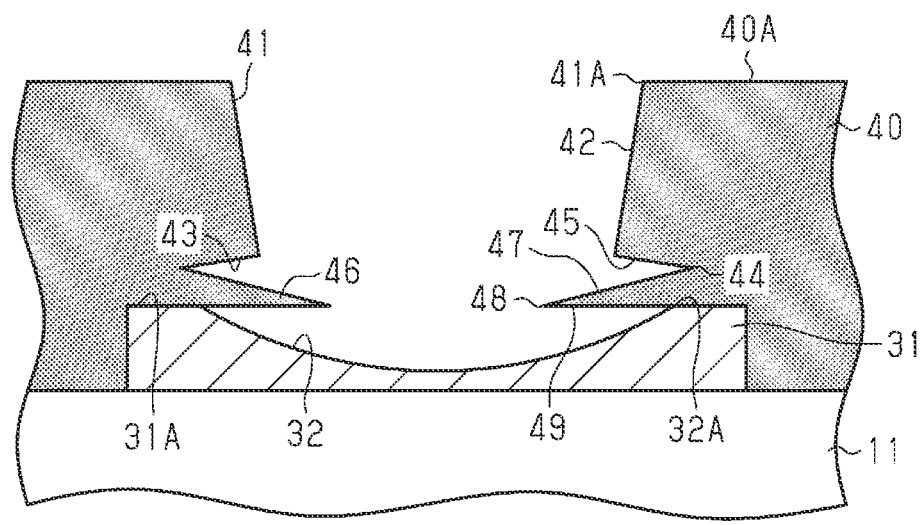

In the step illustrated in FIG. 4A, the recess 32 is formed in the upper surface 31A of the wiring layer 31, which is exposed from the open portion 41 in the solder resist layer 40, and connected with the open portion 41. The recess 32 may be formed, for example, by performing wet etching on the wiring layer 31 using the solder resist layer 40 as an etching mask. When such wet etching is performed on the wiring layer 31, a side-etching effect occurs and etching occurs in a planar direction of the wiring layer 31. This forms the recess 32 extending into the wiring layer 31 toward the outer side of the open portion 41 from the bottom of the open portion 41. Thus, the recess 32 is formed in the upper surface of the wiring layer 31 with a larger opening width than the opening width at the projection end 48, which is the lower end of the open portion 41. The recess 32 exposes the lower surface 49 of the projection 46.

Figure 4B:
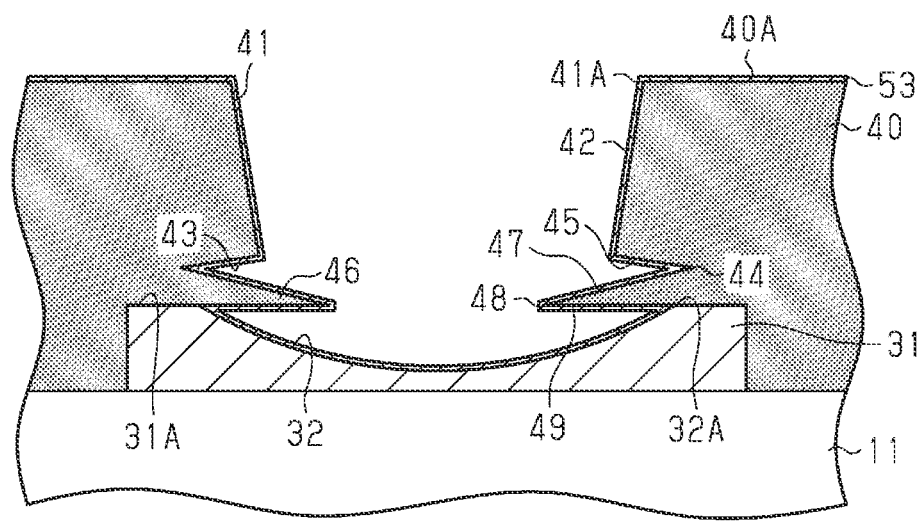

In the step illustrated in FIG. 4B, the seed layer 53 is formed to continuously cover the entire upper surface 40A of the solder resist layer 40, the entire surface of the open portion 41, and the entire surface of the recess 32. The seed layer 53 may be formed, for example, in an electroless plating process. For example, the seed layer 53 may be formed in an electroless copper plating process using a plating solution that includes a mixture of copper sulfate, sodium hydroxide, carboxylate, nickel sulfate, and formaldehyde.

Figure 5A:
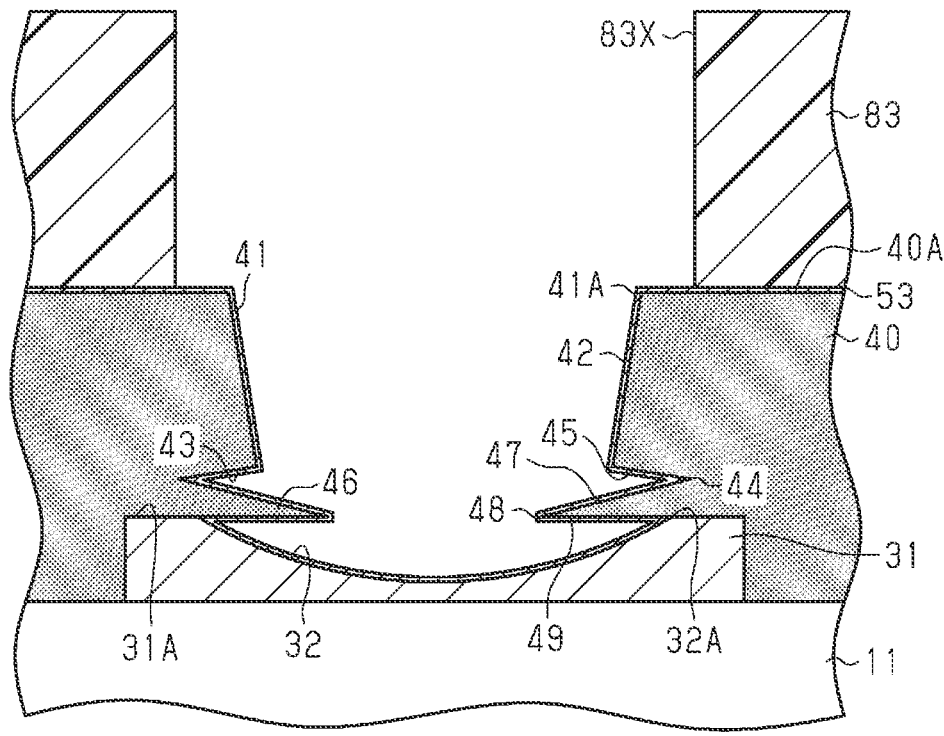

In the step illustrated in FIG. 5A, a resist layer 83 including an opening pattern 83X is formed on the seed layer 53, which is formed on the upper surface 40A of the solder resist layer 40. The opening pattern 83X exposes portions of the seed layer 53 that correspond to regions in which the metal posts 55 are arranged (refer to FIG. 1B). The material of the resist layer 83 may be, for example, a material that is resistant to electrolytic plating performed in a subsequent step. For example, the material of the resist layer 83 may be a photosensitive dry film resist, a liquid photoresist (e.g., a dry film resist or liquid resist such as novolac resin and acrylic resin), or the like. For example, when a photosensitive dry film resist is used, a dry film is laminated on the upper surface of the seed layer 53 by thermocompression bonding. Then, photolithography is performed to pattern the dry film and form the resist layer 83 including the opening pattern 83X. When a liquid photoresist is used, the resist layer 83 may be formed in the same manner.

Figure 5B:
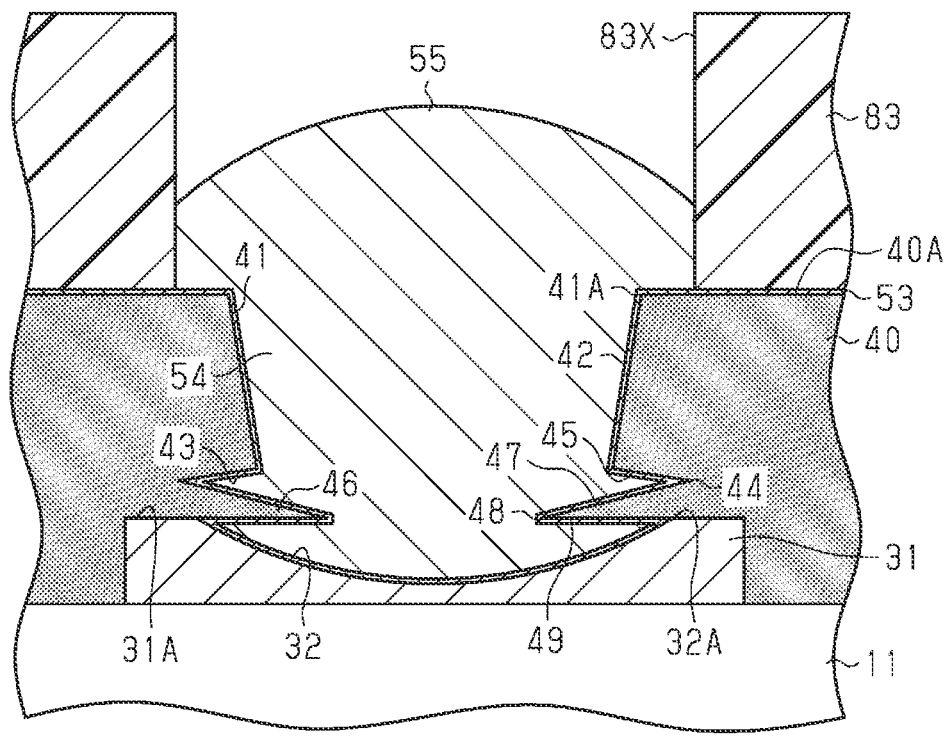

In the step illustrated in FIG. 5B, an electrolytic plating process is performed on the seed layer 53 using the resist layer 83 as a plating mask and the seed layer 53 as a plating power feeding layer. That is, an electrolytic plating process (e.g., electrolytic copper plating process) is performed on the upper surface of the seed layer 53 exposed from the opening pattern 83X of the resist layer 83. In the present step, the metal layer 54 is formed to fill the open portion 41 and the recess 32 at the inner side of the seed layer 53, and the metal post 55 is formed in the opening pattern 83X. The metal layer 54 fills the depression 43 and covers the inclined surface 47 and the lower surface 49 of the projection 46. Further, in the present example, the upper surface of the metal post 55 is convex. When an electrolytic plating process is performed to form a plating film such as a copper plating film in the opening pattern 83X, the surface of the plating film is first concave, then gradually becomes flat, and consequently becomes convex. In the present example, the film-formation is stopped when the upper surface of the metal post 55 becomes convex. The film-formation may be stopped in a state in which the upper surface of the metal post 55 is flat or concave.

Figure 6A:
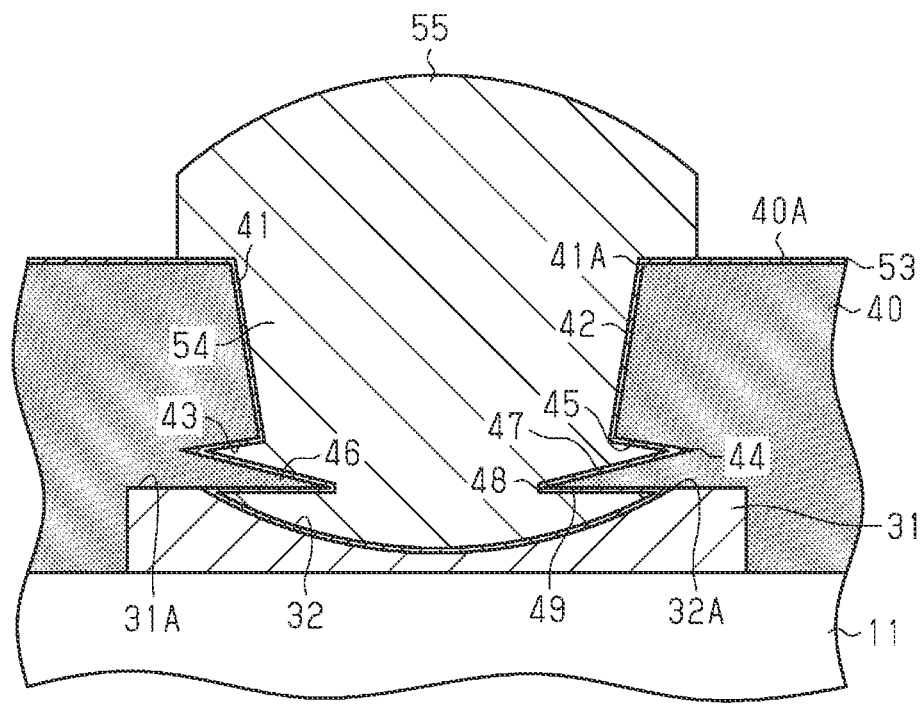

In the step illustrated in FIG. 6A, the resist layer 83 illustrated in FIG. 5B is removed with an alkaline removing solution (e.g., organic amine-based removing liquid, caustic soda, acetone, ethanol).

Figure 6B:
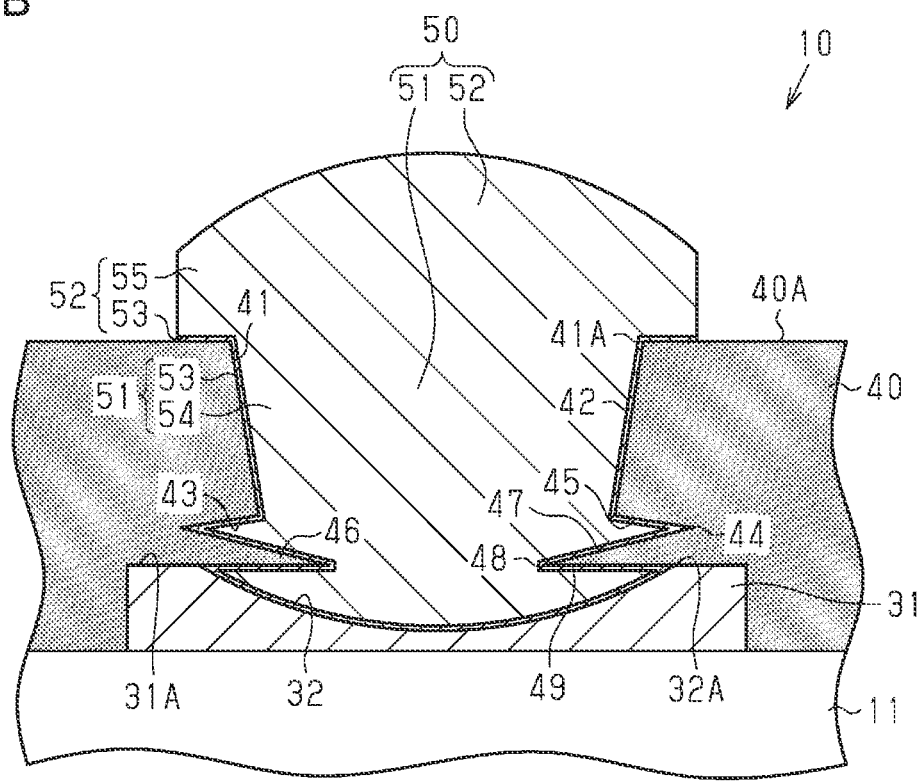

Then, as illustrated in FIG. 6B, the unnecessary portion of the seed layer 53 is removed by performing etching with the metal post 55 as an etching mask. When the seed layer 53 is an electroless copper plating layer, for example, the unnecessary portion of the seed layer 53 is removed by performing wet etching using an etching solution that is sulfuric acid/hydrogen peroxide based. This forms the connection terminal 50 including the via wiring 51, which is formed in the open portion 41 and the recess 32 by the seed layer 53 and the metal layer 54, and the rod-shaped terminal 52, which is formed on the upper surface 40A of the solder resist layer 40 by the seed layer 53 and the metal post 55.

The manufacturing steps described above allows the wiring substrate 10 illustrated in FIGS. 1A and 1B to be manufactured.

The operation and advantages of the present embodiment will now be described.

(1) The terminal structure of the wiring substrate 10 includes the wiring layer 31, the solder resist layer 40, the open portions 41, and the connection terminals 50. The solder resist layer 40 covers the wiring layer 31. Each open portion 41 extends through the solder resist layer 40 in the thickness-wise direction and exposes part of the upper surface of the wiring layer 31. Each connection terminal 50 is formed on the wiring layer 31, which is exposed from the open portion 41. The depression 43 and the projection 46 are continuous and formed at the bottom of the open portion 41. The depression 43 is depressed toward the outer side of the open portion 41 from the wall surface 42, which extends downward from the upper surface 40A of the solder resist layer 40. The projection 46 is formed under the depression 43 and projects from the depression 43 further inward of the open portion 41 than the wall surface 42. With this structure, the depression 43 is filled with the connection terminal 50 formed on the wiring layer 31 exposed from the open portion 41. This results in part of the connection terminal 50 (part of connection terminal 50 filling depression 43) extending into the solder resist layer 40. This produces an anchor effect that improves the adhesion of the connection terminal 50 and the solder resist layer 40 and effectively inhibits separation of the connection terminal 50 from the solder resist layer 40. Thus, the connection reliability of the wiring layer 31 and the connection terminal 50 is improved.

(2) When mounting the semiconductor element 70 on the wiring substrate 10, there is a tendency of a large amount of stress being applied to the vicinity of the interface between the connection terminal 50 and the wiring layer 31. The stress may produce cracks in the interface of the connection terminal 50 and the wiring layer 31. Such cracks may separate the connection terminal 50 from the wiring layer 31.

In this respect, the wiring substrate 10 of the present embodiment includes the projection 46 that is arranged at the bottom of the open portion 41 projecting into the open portion 41. This structure allows the projection 46, which has a higher elasticity than the metal connection terminal 50, to be arranged between the connection terminal 50 and the wiring layer 31. The elasticity of the projection 46 reduces the stress generated at the interface of the connection terminal 50 and the wiring layer 31. This avoids the formation of cracks in the interface of the connection terminal 50 and the wiring layer 31. As a result, the separation of the connection terminal 50 from the wiring layer 31 is effectively inhibited.

(3) The depression 43 and the projection 46 are continuous and formed at the bottom of the open portion 41. This forms a step at the bottom of the open portion 41. That is, a step is formed at the bottom of the open portion 41 by the inner surface 45 of the depression 43 and the inclined surface 47 of the projection 46. This structure also allows a step to be formed in the interface of the open portion 41 and the connection terminal 50 which fills the open portion 41. The step may, for example, stop cracks from spreading in the interface of the solder resist layer 40, which forms the open portion 41, and the connection terminal 50. For example, when mounting the semiconductor element 70 on the wiring substrate 10, if a crack forms in the interface of the connection terminal 50 and the wiring layer 31, the crack may spread in the interface of the solder resist layer 40, which forms the open portion 41, and the connection terminal 50. In the wiring substrate 10 of the present embodiment, a step is formed at the bottom of the open portion 41 to stop spreading of the crack. That is, the innermost end 44 of the depression 43 stops the spreading of the crack. Thus, cracking is stopped at the bottom of the open portion 41, that is, the spreading of cracks is stopped within a small range. This effectively inhibits separation of the connection terminal 50 from the solder resist layer 40 that may be caused by cracking. As a result, the connection reliability of the wiring layer 31 and the connection terminal 50 is improved.

(4) The opening width of the open portion 41 at the depression 43 is larger than the opening width of the open portion 41 at the open end 41A, which is located at the upper side of the open portion 41. In this manner, the depression 43 extends widely toward the outer side of the open portion 41. Thus, the connection terminal 50 filling the depression 43 is extends over a long distance into the solder resist layer 40. This improves the adhesion between the connection terminal 50 and the solder resist layer 40 and effectively limits separation of the connection terminal 50 from the solder resist layer 40.

(5) The interior angle θ4 between the inner surface 45 of the depression 43 and the inclined surface 47 of the projection 46 is larger than the inclination angle θ2, that is the interior angle between the inclined surface 47 and the lower surface 49 of the solder resist layer 40. This allows the inclined surface 47 to be shorter than when the angle θ4 is smaller than the inclination angle θ2, if the planar position of the projection end 48 and the length of the inner surface 45 were to be the same. Thus, even when a crack forms in the interface of the connection terminal 50 and the wiring layer 31, the distance over which the crack will spread, for example, the distance from the projection end 48 to the innermost end 44, will be decreased. Therefore, the spreading of a crack is effectively stopped within a small range.

(6) The recess 32 is formed in the upper surface of the wiring layer 31 and connected with the open portion 41 to expose the lower surface 49 of the projection 46. Then, the connection terminal 50 is formed to fill the recess 32. This structure allows the connection terminal 50 to cover both the upper and lower surfaces of the projection 46. Thus, part of the connection terminal 50 (portion of connection terminal 50 filling recess 32) extends into the solder resist layer 40. This produces an anchor effect that improves the adhesion of the connection terminal 50 and the solder resist layer 40. As a result, separation of the connection terminal 50 from the solder resist layer 40 is further effectively inhibited.

Other Embodiments

The above embodiment may be modified as follows. The above embodiment and the following modifications can be combined as long as the combined modifications remain technically consistent with each other.

In the open portion 41 of the above embodiment, the interior angle θ3 between the wall surface 42 and the inner surface 45 may be smaller than the interior angle θ4 between the inner surface 45 and the inclined surface 47.

In the open portion 41 of the above embodiment, the interior angle θ4 between the inner surface 45 and the inclined surface 47 may be smaller than the inclination angle θ2, that is, the interior angle between the inclined surface 47 and the lower surface 49.

Figure 7:
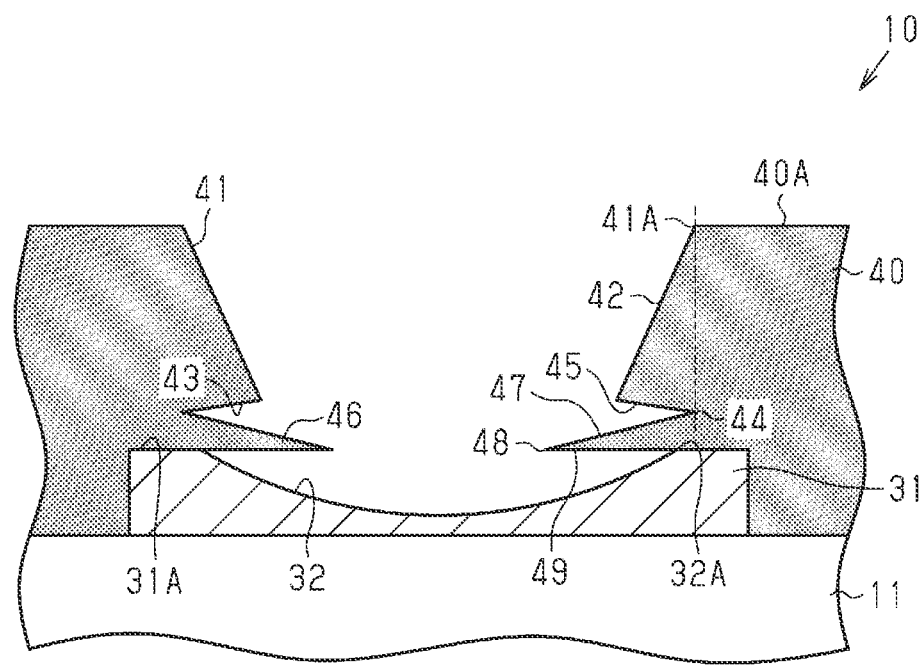
FIGS. 7, 8, 9, and 10 are schematic cross-sectional views illustrating various modified examples of the wiring substrate illustrated in FIG. 1A.

As illustrated in FIG. 7, in the open portion 41, for example, the innermost end 44 of the depression 43 may be located at a position overlapped with the open end 41A, which is located at the upper side of the open portion 41, in a plan view. In this case, the opening width of the open portion 41 at the open end 41A is substantially equal to the opening width of the open portion 41 at the innermost end 44. Alternatively, the innermost end 44 may be located closer to the planar center of the open portion 41 than the open end 41A in a plan view. Although not illustrated in FIG. 7 for simplicity, the connection terminal 50 is formed in the opening 41 to fill the depression 43 and the recess 32. The connection terminal 50 may include both of the via wiring 51 and the rod-shaped terminal 52 or include only the via wiring 51.

Figure 8:
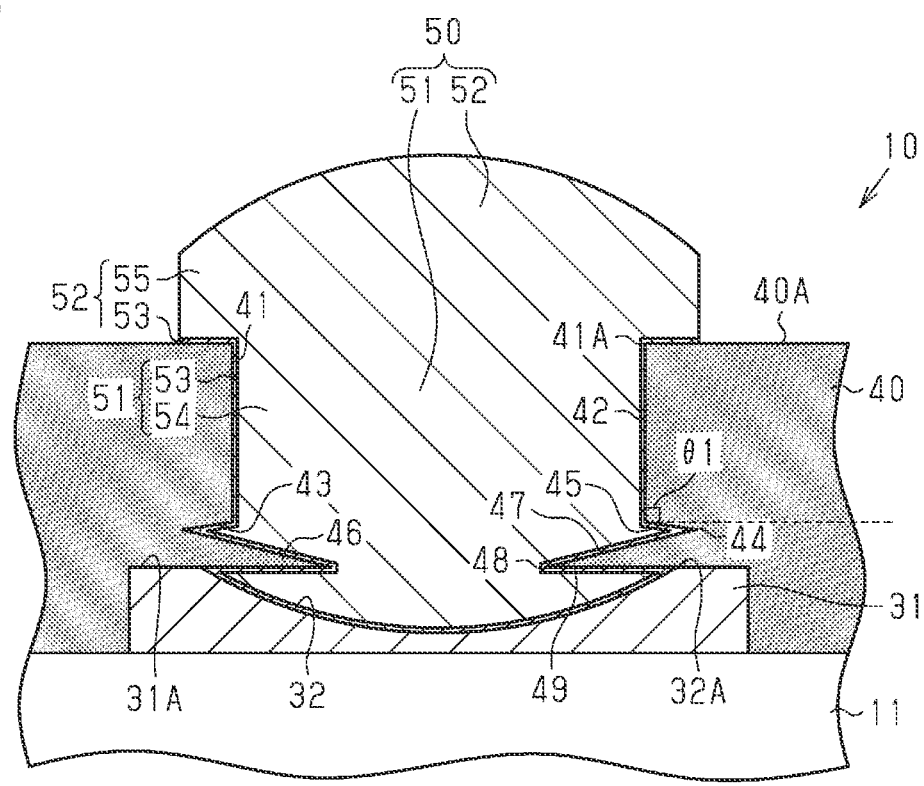

As illustrated in FIG. 8, in a cross-sectional view, for example, the wall surface 42 of the open portion 41 may extend substantially orthogonal to the upper surface 40A of the solder resist layer 40. For example, the wall surface 42 may be formed so that the inclination angle θ1 of the wall surface 42 is substantially equal to ninety degrees.

In the above embodiment, the upper surface of the metal post 55 is a convex surface. However, there is no limitation to such a structure. For example, the upper surface of the metal post 55 may be a concave surface. Alternatively, the upper surface of the metal post 55 may be a flat surface.

In the above embodiment, the connection terminal 50 includes the via wiring 51, which fills the open portion 41 and the recess 32, and the rod-shaped terminal 52, which projects upward from the upper surface 40A of the solder resist layer 40. Alternatively, for example, the rod-shaped terminal 52 may be omitted. In this case, the connection terminal 50 is formed by only the via wiring 51.

Figure 9:
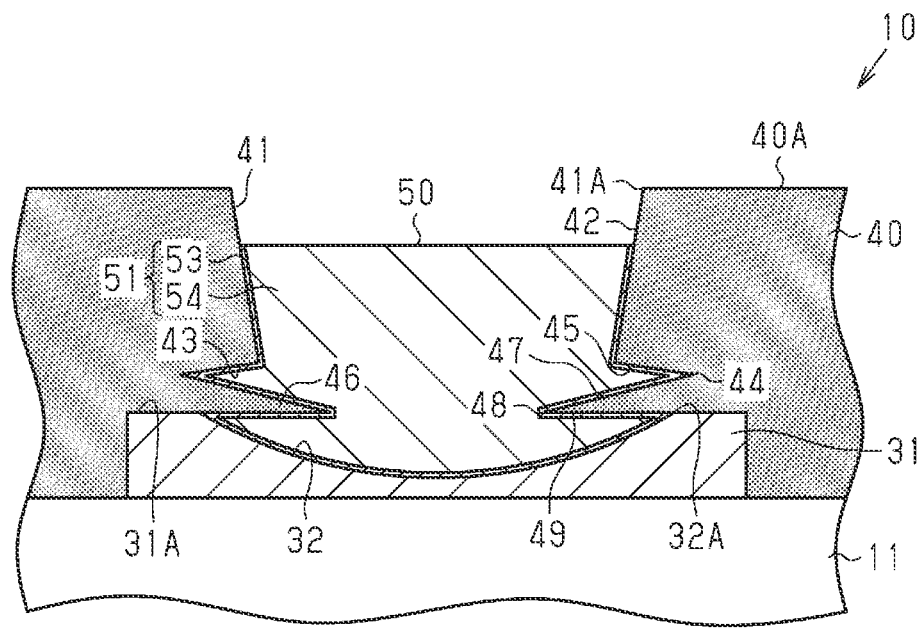

As illustrated in FIG. 9, for example, the via wiring 51 may be modified so that the via wiring 51 is embedded up to an intermediate part of the open portion 41 in the depth-wise direction. That is, the via wiring 51 does not have to fill the entire open portion 41. In this modified example, the depression 43 of the open portion 41 is filled with the via wiring 51.

In the above embodiment, the opening width of the recess 32 is not limited. For example, in a plan view, the open end 32A of the recess 32 may be located closer to the planar center of the open portion 41 than the lower end of the wall surface 42 of the open portion 41. For example, in a plan view, the open end 32A of the recess 32 may be located farther from the planar center of the open portion 41 than the innermost end 44 of the depression 43.

Figure 10:
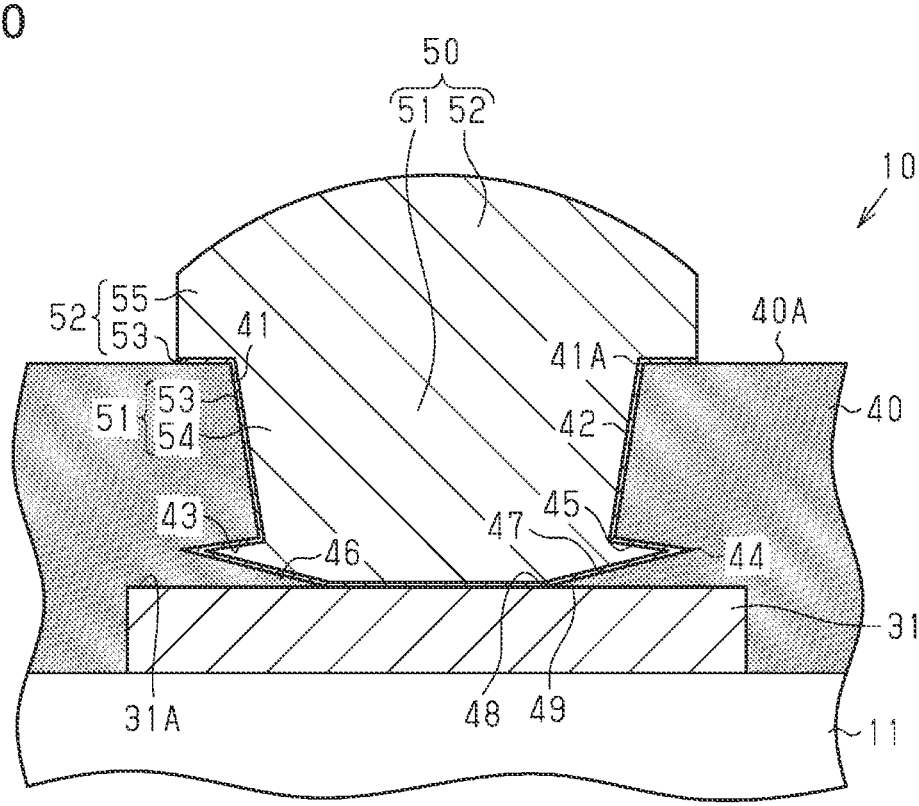

As illustrated in FIG. 10, for example, the recess 32 of the wiring layer 31 does not have to be formed. In this case, the connection terminal 50 is formed on the upper surface 31A of the wiring layer 31, which is exposed from the bottom of the open portion 41. In this modified example, only the open portion 41 is filled with the via wiring 51. Further, in this modified example, the seed layer 53 continuously covers the upper surface 40A of the solder resist layer 40, the wall surface 42 of the open portion 41, the inner surface 45 of the depression 43, the inclined surface 47 of the projection 46, and the upper surface 31A of the wiring layer 31 exposed from the bottom of the open portion 41.

In the above embodiment, the seed layer 53 is formed in an electroless plating process (e.g., electroless copper plating process) but does not have to be formed in such a manner. For example, the seed layer 53 may be formed through sputtering, vapor-deposition, or the like.

In the above embodiment, the seed layer 53 is a single-layered seed layer but may be a multi-layered (e.g., double-layered) seed layer. An example of a double-layered seed layer 53 is a seed layer in which a titanium (Ti) layer and a Cu layer are laminated in order.

In the above embodiment, the connection terminal 50 includes the seed layer 53, which is an electroless plating layer, and the metal layer 54 and the metal post 55, which are electrolytic plating layers, but does not have to be formed in such a manner. For example, the connection terminal 50 may be a solder bump. For example, a solder ball may be melted on the wiring layer 31, which is exposed from the bottom of the open portion 41, to form the solder bump. Alternatively, the wiring layer 31, which is exposed from the bottom of the open portion 41, may undergo solder plating or the like to form the solder bump. In this case, for example, in the step illustrated in FIG. 5B, the connection terminal 50 is a solder bump formed by performing electrolytic solder plating using the seed layer 53 as a plating power feeding layer.

In the above embodiment, the surface-processed layer 23 may be omitted from the wiring substrate 10.

In the above embodiment, the solder resist layer 40 is an example of a protective insulation layer, which is the outermost layer of the wiring substrate 10. However, a protective insulation layer may be formed by various types of photosensitive, insulative resins.

In the above embodiment, the underfill resin 61 may be omitted from the semiconductor device 60.

In the above embodiment, the external connection terminal 62 may be omitted from the semiconductor device 60.

In the above embodiment, an electronic component other than the semiconductor element 70 may be mounted on the wiring substrate 10. For example, a crystal oscillator or a chip component such as a chip capacitor, a chip resistor, or a chip inductor may be mounted on the wiring substrate 10.

The wiring substrate 10 of the above embodiment may be a wiring substrate used for a package such as a chip size package (CSP), a small out line non-lead package (SON), or the like.

Clauses

This disclosure further encompasses the following embodiments.

1. A method for manufacturing a terminal structure, the method including:
   forming a protective insulation layer that covers a wiring layer;
   performing photolithography to form an open portion in the protective insulation layer to expose part of an upper surface of the wiring layer; and
   forming a connection terminal on the wiring layer exposed from the open portion, in which:
   the open portion includes a wall surface extending downward from an upper surface of the protective insulation layer, a depression depressed into the protective insulation layer from the wall surface toward an outer side of the open portion in a plan view, and a projection formed under the depression continuously with the depression and projected from the depression into the open portion further inward than the wall surface; and
   the depression is filled with the connection terminal.

2. The method according to clause 1, further including:
   forming a recess in the upper surface of the wiring layer to be connected with the open portion, in which
   the recess exposes a lower surface of the projection, and
   the recess is filled with the connection terminal.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A terminal structure, comprising:
   a wiring layer;
   a protective insulation layer that covers the wiring layer;
   an open portion that extends through the protective insulation layer in a thickness-wise direction to expose part of an upper surface of the wiring layer; and
   a connection terminal formed on the wiring layer exposed from the open portion, wherein:
   the open portion includes
      a wall surface extending downward from an upper surface of the protective insulation layer,
      a depression depressed into the protective insulation layer from the wall surface toward an outer side of the open portion, and
      a projection formed under the depression, continuously with the depression, and projected from the depression into the open portion further inward than the wall surface in a plan view;
   the depression is filled with the connection terminal
   the wiring layer includes a recess formed in the upper surface of the wiring layer and connected with the open portion;
   the recess exposes a lower surface of the projection;
   the recess is filled with the connection terminal;
   the open portion has a first opening width at an open end located at an upper end of the wall surface and a second opening width at the depression;
   the recess has an opening width at a recess open end located at the upper surface of the wiring layer;
   the opening width of the recess is larger than the first opening width and smaller than the second opening width;
   the wall surface is inclined from the upper surface of the protective insulation layer toward the depression so as to approach a planar center of the open portion;
   the depression includes
      an innermost end that is a deepest part of the depression, and
      an inner surface extending from a lower end of the wall surface toward the outer side of the open portion to the innermost end,
   wherein an interior angle between the wall surface and the inner surface is an obtuse angle.

2. The terminal structure according to claim 1, wherein the open portion has a third opening width at the projection, and the third opening width is set as a smallest opening width of the open portion.

3. The terminal structure according to claim 1, wherein the projection includes:
   a projection end located further inward of the open portion than the lower end of the wall surface in a plan view, and
   an inclined surface extending from the innermost end to the projection end,
   wherein the interior angle between the wall surface and the inner surface is larger than an interior angle between the inner surface and the inclined surface.

4. The terminal structure according to claim 3, wherein the projection includes a lower surface continuous with the projection end, and the interior angle between the inner surface and the inclined surface is larger than an interior angle between the inclined surface and the lower surface of the projection.

5. The terminal structure according to claim 1, wherein the projection includes:
   a projection end located further inward in the open portion than the lower end of the wall surface in a plan view,
   an inclined surface extending from the innermost end to the projection end, and
   a lower surface continuous with the projection end, wherein an interior angle between the inner surface and the inclined surface is larger than an interior angle between the inclined surface and the lower surface of the projection.

6. The terminal structure according to claim 1, wherein the connection terminal includes a via wiring formed in the open portion.

7. The terminal structure according to claim 1, wherein the connection terminal includes
   a via wiring that fills the open portion, and
   a rod-shaped terminal projecting upward from the upper surface of the protective insulation layer.

8. A wiring substrate, comprising the terminal structure according to claim 1.

9. The terminal structure according to claim 1, wherein the connection terminal includes:
   a seed layer that covers a surface of the recess, a surface of the open portion, and the upper surface of the protective insulation layer; and
   a metal layer that fills the open portion and the recess at an inner side of the seed layer and is formed on the seed layer located on the upper surface of the protective insulation layer.

\* \* \* \* \*